United States Patent
Miyazoe et al.

(10) Patent No.: US 10,833,268 B2
(45) Date of Patent: Nov. 10, 2020

(54) RESISTIVE MEMORY CROSSBAR ARRAY WITH A MULTILAYER HARDMASK

(71) Applicant: International Business Machines Corporation, Armonk, NY (US)

(72) Inventors: Hiroyuki Miyazoe, White Plains, NY (US); Takashi Ando, Tuckahoe, NY (US); Asit Ray, Baldwin Place, NY (US); Seyoung Kim, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 91 days.

(21) Appl. No.: 16/287,485

(22) Filed: Feb. 27, 2019

(65) Prior Publication Data

US 2020/0274067 A1    Aug. 27, 2020

(51) Int. Cl.
*H01L 45/00* (2006.01)
*H01L 27/24* (2006.01)

(52) U.S. Cl.
CPC ...... *H01L 45/1675* (2013.01); *H01L 27/2463* (2013.01); *H01L 45/1253* (2013.01); *H01L 45/146* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 7,169,637 B2 * | 1/2007 | Zhang | H01L 45/1675 257/E21.49 |
| 8,956,982 B2 | 2/2015 | Tsubata et al. | |
| 8,975,088 B2 | 3/2015 | Satoh et al. | |
| 9,029,231 B2 | 5/2015 | Toh et al. | |
| 9,406,877 B2 * | 8/2016 | Tada | H01L 27/228 |
| 9,595,670 B1 * | 3/2017 | Gee | H01L 45/146 |
| 2010/0327248 A1 * | 12/2010 | Khoueir | H01L 43/12 257/2 |
| 2011/0233500 A1 * | 9/2011 | Nishimura | H01L 27/2463 257/2 |
| 2017/0294581 A1 | 10/2017 | Kim et al. | |
| 2020/0126791 A1 * | 4/2020 | Rizzolo | H01L 21/0332 |

FOREIGN PATENT DOCUMENTS

WO    2018161835 A1    9/2018

OTHER PUBLICATIONS

Wong, et al., "Metal-Oxide RRAM," vol. 100, No. 6, Jun. 2012, Proceedings of the IEEE, 20 pages.
EMRL.DE, "EMRL," Retrieved: Jan. 14, 2019, 9 pages.
Baek, et al., "Realization of Vertical Resistive Memory (VRRAM) using cost effective 3D Process," © 2011 IEEE, p. 737.
Unknown, "Resistive Memory Crossbar Array with Top Electrode Inner Spacers," U.S. Appl. No. 16/037,325, filed Jul. 17, 2018.

* cited by examiner

*Primary Examiner* — Grant S Withers
(74) *Attorney, Agent, or Firm* — Amin, Turocy & Watson, LLP

(57) ABSTRACT

Devices and/or methods that facilitate forming a resistive memory crossbar array with a multilayer hardmask are provided. In some embodiments, a resistive random access memory (RRAM) can comprise a multilayer hardmask comprising three layers, an interlayer oxide between a first layer of silicon nitride and a second layer of silicon nitride. In other embodiments, an RRAM can comprise a multilayer hardmask comprising two layers, a layer of an oxide on a layer of silicon nitride.

16 Claims, 16 Drawing Sheets

RESISTIVE MEMORY CROSSBAR ARRAY WITH A MULTILAYER HARDMASK

BACKGROUND

The subject disclosure relates to semiconductor devices, and more specifically, to a resistive memory crossbar array with a multilayer hardmask.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments herein, devices and/or methods that facilitate forming a resistive memory crossbar array with a multilayer hardmask are described.

According to one embodiment, a device is provided. The device can comprise a resistive random access memory (RRAM) comprising a multilayer hardmask, wherein the multilayer hardmask comprises an interlayer oxide.

According to another embodiment, a method is provided. The method can comprise forming an RRAM comprising a multilayer hardmask, wherein the multilayer hardmask comprises an interlayer oxide.

According to another embodiment, a device is provided. The device can comprise an RRAM comprising a multilayer hardmask, wherein the multilayer hardmask comprises an interlayer oxide on a layer of silicon nitride.

DETAILED DESCRIPTION

Figure 1:
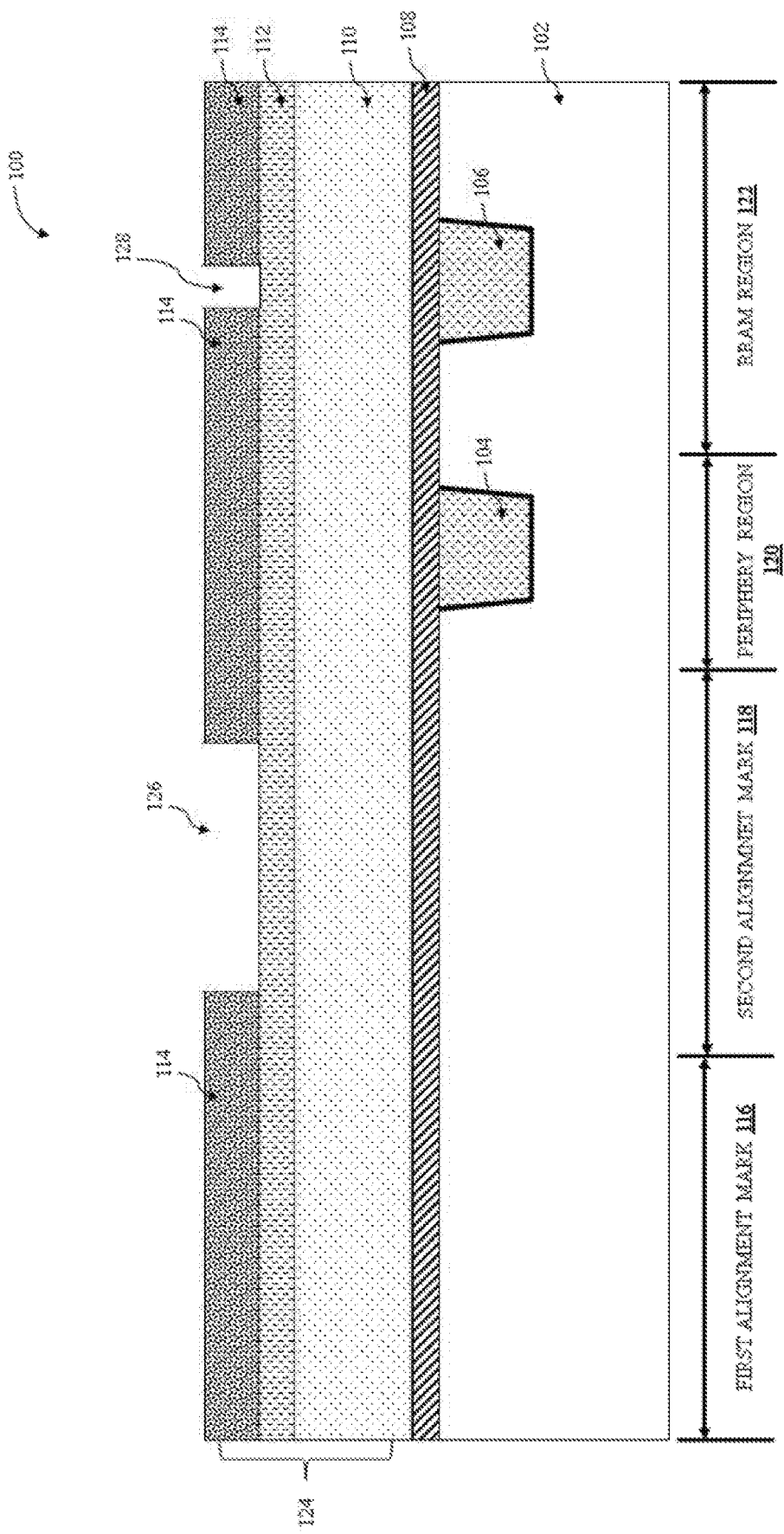
FIG. 1 illustrates a cross-sectional diagram of a semiconductor structure including conductive lines formed within an interlayer dielectric, a silicon nitride cap deposited over the interlayer dielectric and a lithographic stack formed over the silicon nitride cap in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Resistive random access memory (RRAM) can be considered as a promising technology for electronic synapse devices or memristor for neuromorphic computing as well as high-density and high-speed non-volatile memory application. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. In order to make a large scale crossbar array, line resistance needs to be minimized to mitigate voltage drop across the line. From this perspective, copper line is preferred. In this case, RRAM stack pillars (e.g., generally, RRAM stacks) can be inserted between two copper lines.

An RRAM stack can include titanium nitride electrodes and high-k dielectrics. Silicon nitride can be used as a hardmask for patterning an RRAM stack, although it may not be very etch resistive to the process chemistries for patterning titanium nitride and high-k dielectrics such as chlorine based and boron trichloride based plasma chemistry. Thick silicon nitride can be used for patterning but may be at a disadvantage for the scaling of RRAM cell. A silicon oxide hardmask can have a better selectivity, however, hardmask deposition under oxygen-containing ambient can oxidize the top electrode and/or passivate oxygen vacancies in the metal oxide layer, which can adversely affect RRAM switching properties.

One or more embodiments described herein depicts an RRAM comprising a multilayer hardmask. The RRAM can be built between copper lines. The RRAM can comprise a first electrode layer selected from a group consisting of titanium nitride, tantalum nitride and tungsten. The RRAM can comprise a metal oxide selected from a group consisting of halfnium oxide, tantalum oxide, titanium oxide and aluminum oxide. The RRAM can comprise a second electrode layer selected from a group consisting of titanium, titanium nitride and a combination of titanium and titanium nitride. The multilayer hardmask can remain in an alignment mark area. In some embodiments, the multilayer hardmask that remains in the alignment mark area can comprise three layers. The multilayer hardmask can comprise an interlayer oxide (e.g., an oxide or an oxide layer) between a first layer of silicon nitride and a second layer of silicon nitride. In other embodiments, the multilayer hardmask that remains in the alignment mark area can comprise two layers. The multilayer hardmask can comprise a layer of an oxide (e.g., the interlayer oxide) on a layer of silicon nitride (e.g., the first layer of silicon nitride, after removal of the second layer of silicon nitride). The interlayer oxide can be deposited on the first layer of silicon nitride. The interlayer oxide can be caused by a surface oxidation of the first layer of silicon nitride. The RRAM stack etch can stop at the interlayer oxide because of high etch resistance to maintain a multi-layer hardmask with two layers. The RRAM stack etch can also stop at the second layer of silicon nitride to maintain a multilayer hardmask with three layers.

FIG. 1 illustrates a cross-sectional diagram of a semiconductor structure 100 including conductive lines (e.g., conductive line 104 and conductive line 106) formed within an interlayer dielectric (ILD) 102, a silicon nitride cap (e.g., dielectric cap) 108 deposited over the ILD 102 and a lithographic stack 124 formed over the silicon nitride cap 108 in accordance with one or more embodiments described herein. The semiconductor structure 100 can comprise conductive line 104 and conductive line 106 formed within an ILD 102. A silicon nitride cap 108 can be deposited over the ILD 102, the conductive line 104 and the conductive line 106. The lithographic stack 124 can be formed over the silicon nitride cap 108 and can comprise an organic planarization layer (OPL) or organic dielectric layer (ODL) 110 (e.g., generally, ODL), an anti-reflective coating (ARC) 112, and a photoresist layer 114.

The semiconductor structure 100 can be defined by four regions. The first region can be designated as a first alignment mark 116, the second region can be designated as a second alignment mark 118, the third region can be designated as an electrical connection region or periphery region 120, and the fourth region can be designated as a memory region or RRAM region 122. The first alignment mark 116 and the second alignment mark 118 can be used to align the wafer such that subsequent layers can be formed at the correct location relative to underlying features. For example, alignment marks can be used to form the vias and conductive lines in the metallization layers in the correct location to make electrical contact to the devices, such as transistors, formed in the underlying substrate.

The ILD 102 can comprise dielectric materials such as, but not limited to, ultra-low-k (ULK) materials. For example, the ILD 102 can comprise ULK materials such as, for example, porous silicate, carbon doped oxide, silicon oxide, silicon nitride, silicon oxynitride, carbon-doped silicon oxide and porous variants thereof, silsesquioxane, siloxane, or other dielectric materials having, for example, a dielectric constant in the range of about 2 to about 4. The ILD 102 can be formed using any method known in the art such as, for example, chemical vapor deposition (CVD), plasma-enhanced chemical vapor deposition (PECVD), atomic layer deposition (ALD), or physical vapor deposition (PVD). The ILD 102 can have a thickness ranging from about 25 nanometer (nm) to about 200 nm.

The conductive line 104 and the conductive line 106 can be formed in the openings or trenches formed in the ILD 102. The conductive line 104 can be in the periphery region 120. The conductive line 106 can be in the RRAM region 122. The conductive line 104 and the conductive line 106 can comprise of any conductive materials known in the art such as, for example, copper, aluminum, or tungsten. The conductive line 104 and the conductive line 106 can be fabricated using any technique known in the art such as, for example, a single or dual damascene technique. In one or more embodiments, not illustrated, the conductive line 104 and the conductive line 106 can comprise of copper and can include a metal liner. The metal liner can comprise metals such as, for example, tantalum nitride and tantalum, titanium, titanium nitride, cobalt, ruthenium, or manganese. Copper can be the preferred material to use for the conductive line 104 and the conductive line 106 in order to make a large scale crossbar array because line resistance needs to be minimize to mitigate the voltage drop across the line, since RRAM stacks can be built between the conductive line 104 and the conductive line 106, The lithographic stack 124 can be employed to pattern the underlying layers (e.g., the ILD 102, the conductive line 106 and the silicon nitride cap 108) based on the location of the alignment marks. The lithographic stack 124 comprising the ODL 110, the ARC 112 and the photoresist layer 114 can be formed over the silicon nitride cap 108. The ODL 110 can be formed over the silicon nitride cap 108. The ARC 112 can be formed over the ODL 110. The photoresist layer 114 can be formed over portions of the ARC 112. More specifically, the photoresist layer 114 can be formed over portions of the ARC 112 leaving an opening 126 in the region of the second alignment mark 118 and an opening 128 in the region of the memory region 122. Furthermore, a portion of the photoresist layer 114 can be deposited on and aligned to the conductive line 104 leaving the opening 128 over the conductive line 106 and the opening 126 over the second alignment mark 116.

The OPL 110 can be formed at a determined thickness to provide reflectivity and topography control. The OPL 110 can comprise an organic material such as a polymer. The thickness of the OPL 110 can be in a range from about 50 nm to about 300 nm. For example, the thickness of the OPL 110 can be about 135 nm.

The ARC 112 can minimize light reflection during lithography. The ARC 112 can comprise silicon, for example, a silicon anti-reflective coating (SiARC). The thickness of the ARC 112 can be in a range from about 10 nm to about 100 nm. The ARC 112 can contain an anti-reflective film for suppressing unintended light reflection during photolithography. Exemplary materials for an anti-reflective film can include, but not limited to, metal silicon nitride or a polymer film. The anti-reflective layer can be formed, depending on materials, for example, using sputter deposition, CVD, or spin coating.

A photolithography process can include applying a photoresist layer 114 (e.g., made of a material that can react when exposed to light) and selectively exposing portions of the photoresist layer 114 to light or other ionizing radiation (e.g., ultraviolet, electron beams, x-rays, etc.), thereby changing the solubility of portions of the material. The photoresist layer 114 can be developed by washing with a developer solution such as, for example, tetramethylammonium hydroxide, thereby removing non-irradiated (in a negative resist) or irradiated (in a positive resist) portions of the photoresist layer 114.

Figure 2:
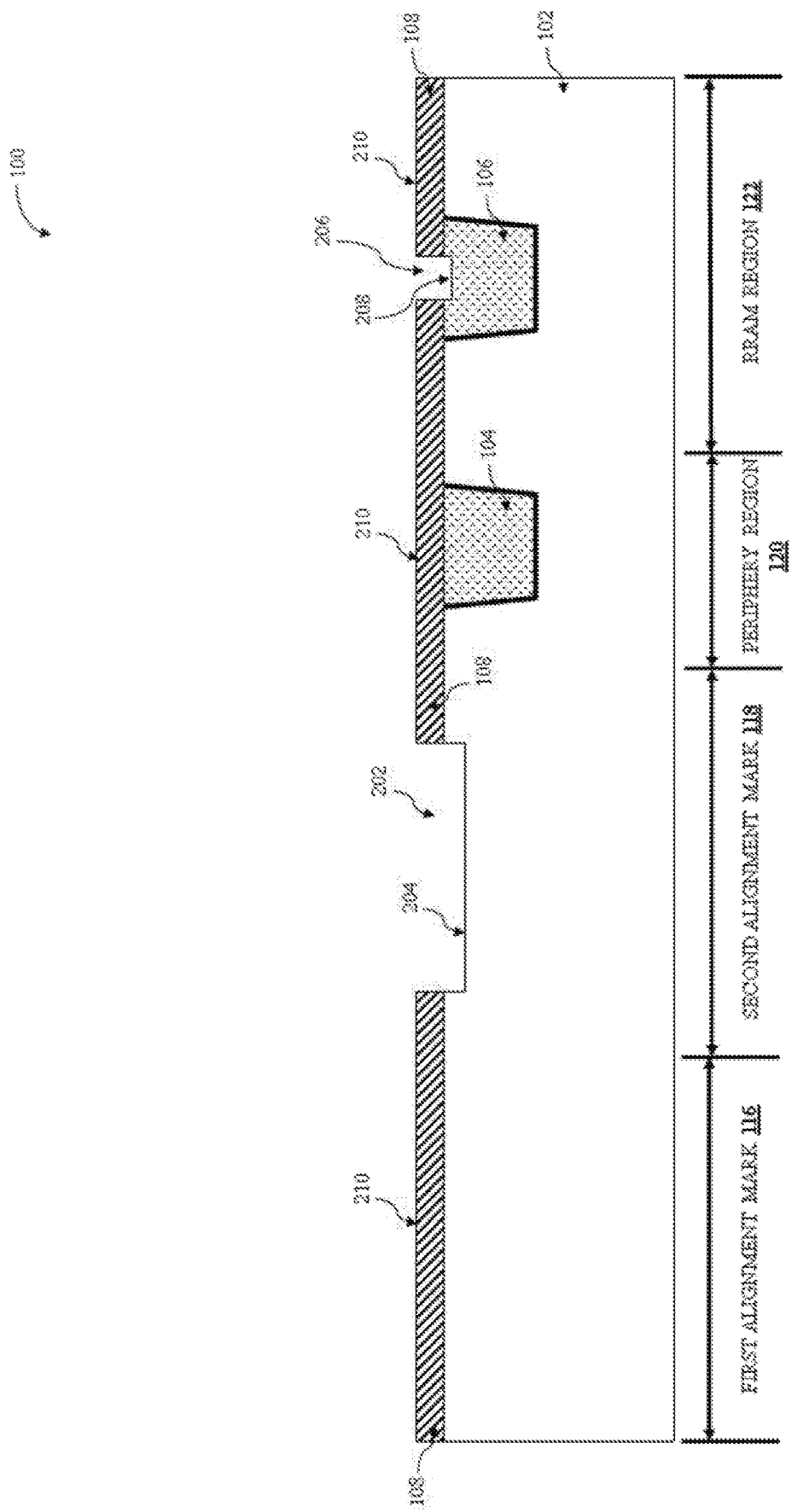
FIG. 2 illustrates a cross-sectional diagram of the semiconductor structure of FIG. 1 with the lithographic stack etched and removed to create openings or trenches in the interlayer dielectric and one or more of the conductive lines in accordance with one or more embodiments described herein.

FIG. 2 illustrates a cross-sectional diagram of the semiconductor structure 100 of FIG. 1 with the lithographic stack 124 etched and removed to create openings or trenches (e.g., a trench 202 and a trench 206) in the ILD 102 and one or more of the conductive lines (e.g., the conductive line 106) in accordance with one or more embodiments described herein. In various example embodiments, the OPL 110, the ARC 112 and the photoresist layer 114 can be etched to form the opening or trench 202 to expose a top surface 204 of the ILD 102 and to form the opening or trench 206 to expose a top surface 208 of the conductive line 106. Additionally, a top surface 210 of the silicon nitride cap 108 can be exposed. A portion of the silicon nitride cap 108 and a portion of the ILD 102 in the region of the second alignment mark 118 can be etched. A portion of the silicon nitride cap 108 and a portion of the conductive line 106 in the RRAM region 122 can be etched.

Figure 3:
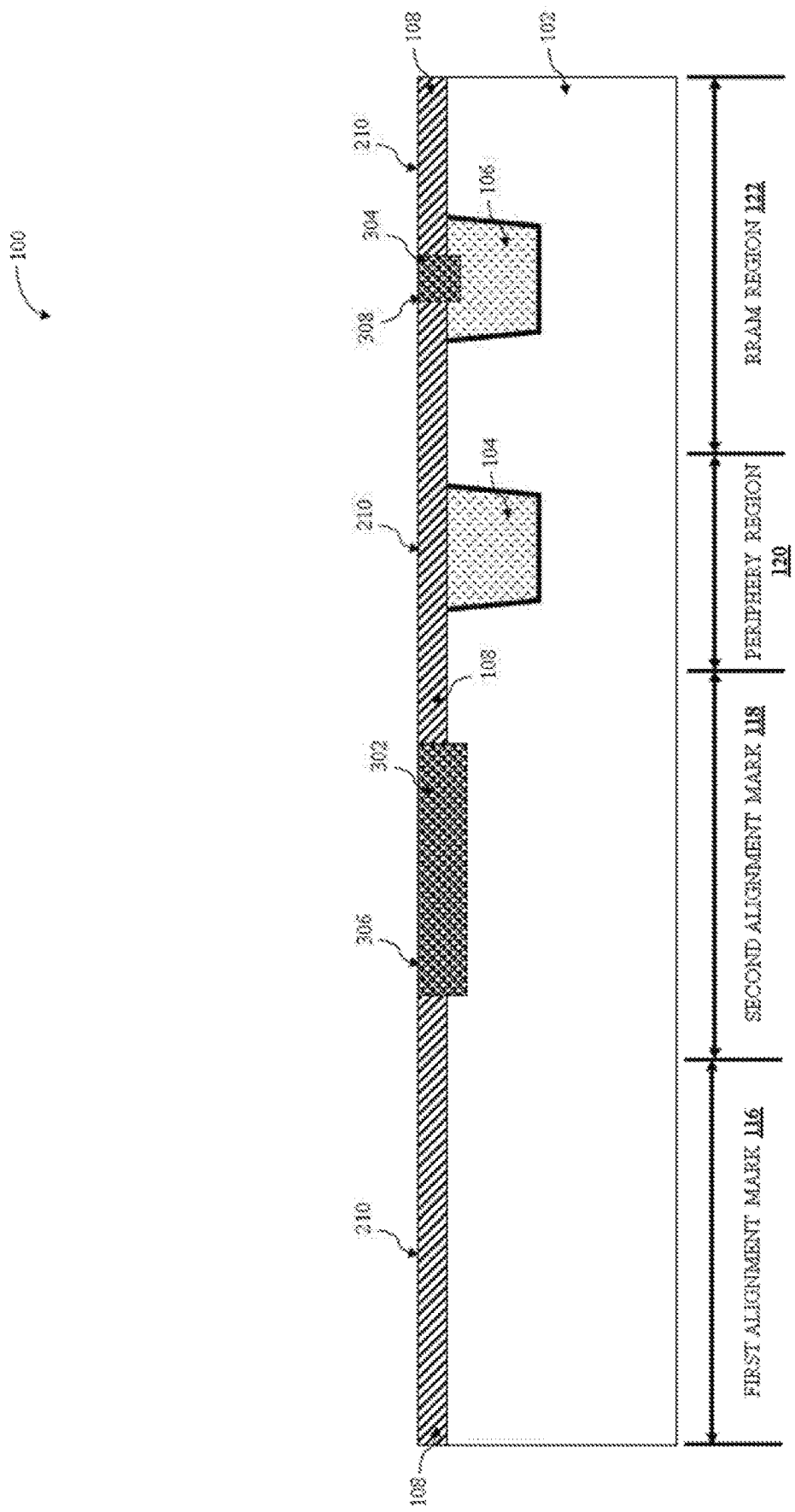
FIG. 3 illustrates a cross-sectional diagram of the semiconductor structure of FIG. 2 with a bottom barrier liner deposited in the trenches and reduced using chemical-mechanical polishing in accordance with one or more embodiments described herein.

FIG. 3 illustrates a cross-sectional diagram of the semiconductor structure 100 of FIG. 2 with a bottom barrier liner (e.g., a metal nitride liner) deposited in the trenches (e.g., the trench 202 and the trench 206) and reduced using chemical-mechanical polishing (CMP) in accordance with one or more embodiments described herein. In various example embodiments, the metal nitride liner can be deposited (e.g., over the silicon nitride cap 108, the trench 202 and the trench 206) and recessed by, for example, CMP such that a first metal nitride layer 302 can be formed in the trench 202 and a second metal nitride layer 304 can be formed in the trench 206. The first metal nitride layer 302 and the second metal nitride layer 304 can be planarized by, for example, CMP such that a top surface 306 of the first metal nitride layer 302 and a top surface 308 of the second metal nitride layer 304 are flushed with the top surface 210 of the silicon nitride cap 108. The first metal nitride layer 302 can be formed in the ILD 102 in the region of the second alignment mark 116 and the second metal nitride layer 304 can be formed in the RRAM region 122. In preferred embodiments, the first metal nitride layer 302 and the second metal nitride layer 304 can comprise tantalum nitride. The first metal nitride layer 302 and second metal nitride layer 304 can be referred to as bottom barrier liners.

Figure 4:
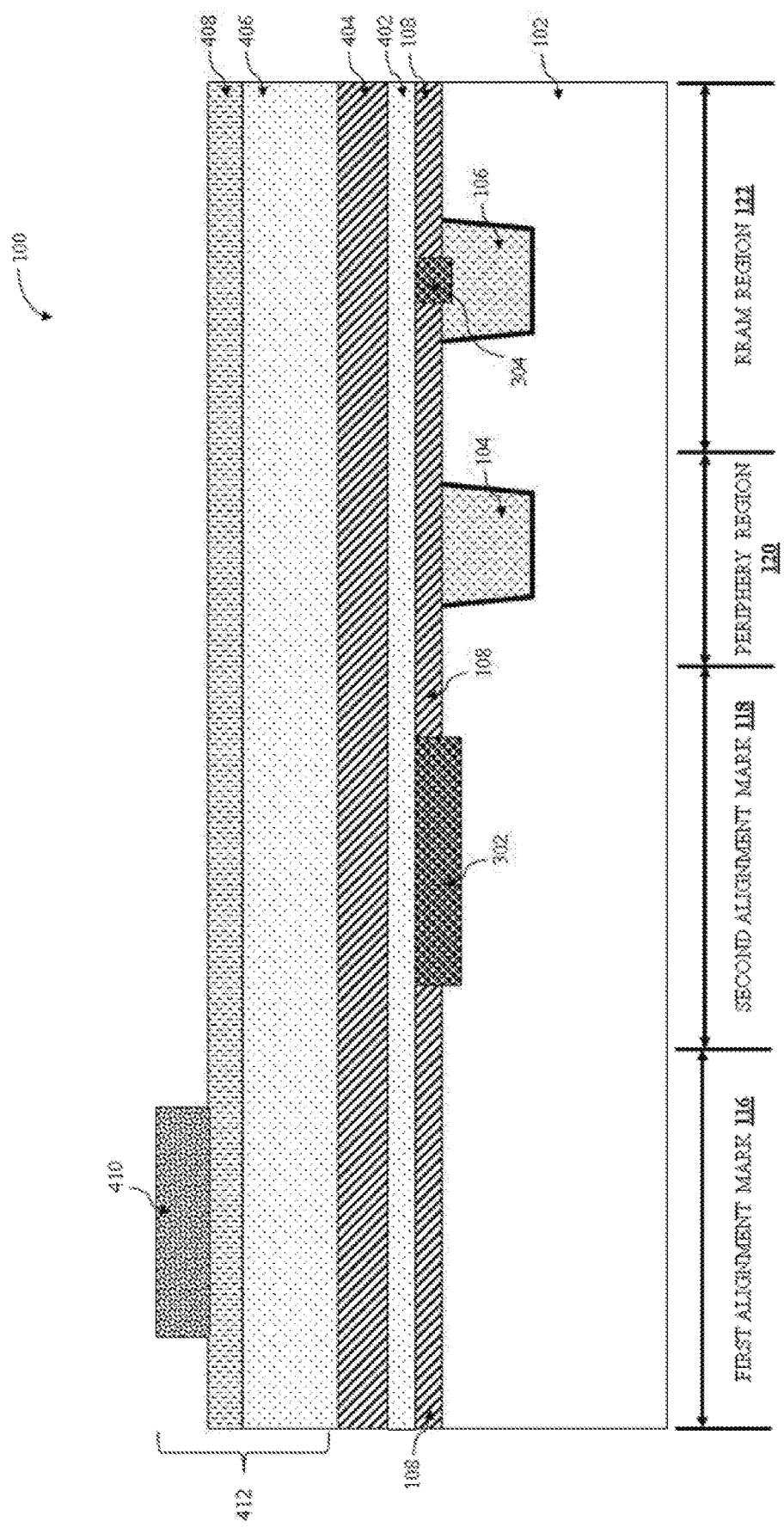
FIG. 4 illustrates a cross-sectional diagram of the semiconductor structure of FIG. 3 with a deposition of a bottom electrode, a silicon nitride hardmask and a lithographic stack 412 in accordance with one or more embodiments described herein.

FIG. 4 illustrates a cross-sectional diagram of the semiconductor structure 100 of FIG. 3 with a deposition of a bottom electrode 402, a silicon nitride hardmask 404 and a lithographic stack 412 (e.g., comprising an ODL 406, an ARC 408 and a photoresist layer 410) in accordance with one or more embodiments described herein. In various example embodiments, the bottom electrode 402 can be deposited in direct contact with the first metal nitride layer 302 and the second metal nitride layer 304. The silicon nitride hardmask 404 can be deposited over the bottom electrode 402. The bottom electrode 402 can comprise a conductive material such as copper, aluminum, silver, gold, platinum, tungsten, etc. In some embodiments, the bottom electrode 402 can comprise a nitride such as titanium nitride, tantalum nitride, tantalum or ruthenium. In preferred embodiments, the bottom electrode 402 can comprise titanium nitride.

In various embodiments, the silicon nitride hardmask 404 can comprise a nitride such as a silicon nitride, an oxynitride such as silicon oxynitride, or a combination thereof, for example. In preferred embodiments, the silicon nitride hardmask 404 can comprise silicon nitride. In one or more embodiments, the silicon nitride hardmask 404 can have a thickness in the range of about 20 nm to about 100 nm, or in the range of about 35 nm to about 75 nm, or in the range of about 45 nm to about 55 nm. It can be appreciated that the silicon nitride hardmask 404 can have other thickness ranges.

The ODL 406 can be formed over the silicon nitride hardmask 404. The ARC 408 can be formed over the ODL 406. The photoresist layer 410 can be aligned to the second alignment mark 118 and formed over a portion of the ARC 408 in the region of the first alignment mark 116. The thickness of the ODL 406 can be in a range from about 50 nm to about 500 nm. For example, the thickness of the ODL 406 can be about 100 nm.

Figure 5:
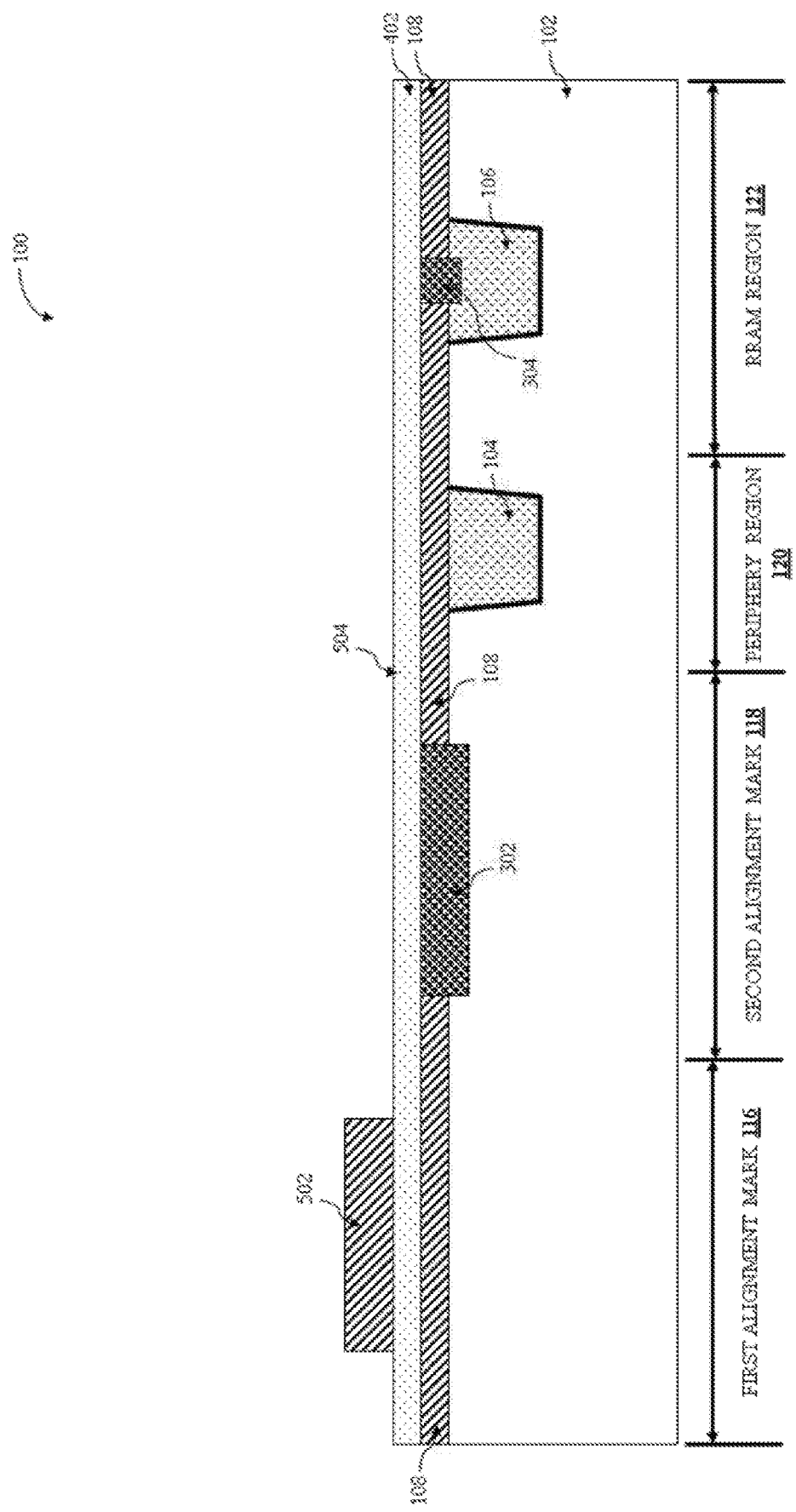
FIG. 5 illustrates a cross-sectional diagram of the semiconductor structure of FIG. 4 with the lithographic stack etched such that a portion of the silicon nitride hardmask in the region of the first alignment mark remains over the bottom electrode in accordance with one or more embodiments described herein.

FIG. 5 illustrates a cross-sectional diagram of the semiconductor structure 100 of FIG. 4 with the lithographic stack 412 etched such that a portion of the silicon nitride hardmask 404 in the region of the first alignment mark 116 remains over the bottom electrode 402 in accordance with one or more embodiments described herein. In various embodiments, the ODL 406, the ARC 408 and the photoresist 410 can be etched to form a silicon nitride hardmask portion 502 over the bottom electrode 402 in the region of the first alignment mark 116. The silicon nitride hardmask portion 502 can be etched by reactive ion etching (RIE). A top surface 504 of the bottom electrode 402 can be exposed. The silicon nitride hardmask portion 502 can be offset from the conductive line 104 and the conductive line 106. The silicon nitride hardmask portion 502 can also be offset from the first metal nitride layer 302 and the second metal nitride layer 304. For example, the silicon nitride hardmask portion 502 can be in the region of the first alignment mark 116. The first metal nitride layer 302 can be in the region of the second alignment mark 118. The conductive line 104 can be in the periphery region 120. The second metal nitride layer 304 and the conductive line 106 can be in the RRAM region 122.

Figure 6:
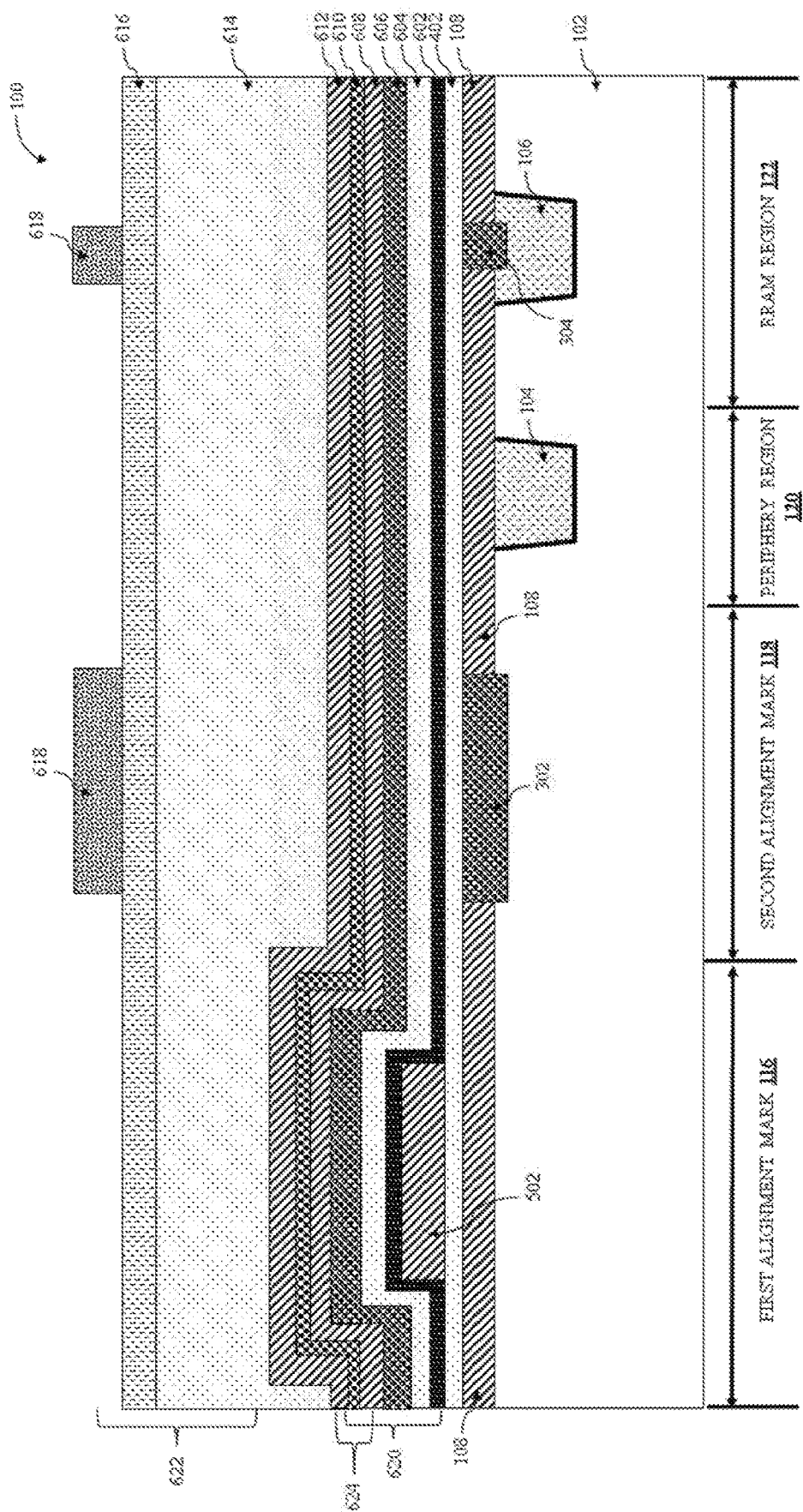
FIG. 6 illustrates a cross-sectional diagram of the semiconductor structure of FIG. 5 with an RRAM stack and a lithographic stack deposited over the RRAM stack in accordance with one or more embodiments described herein.

FIG. 6 illustrates a cross-sectional diagram of the semiconductor structure 100 of FIG. 5 with an RRAM stack 620 and a lithographic stack 622 deposited over the RRAM stack 620 in accordance with one or more embodiments described herein. The RRAM stack 620 can be formed over the bottom electrode 402 and the silicon nitride hardmask portion 502. In various embodiments, the RRAM stack 620 can comprise six layers. The first layer can be a hafnium oxide layer 602. The hafnium oxide layer 602 can be any type of high-k dielectric such as, but not limited to, hafnium oxide, hafnium silicate, hafnium silicon oxynitride, hafnium zirconium oxide, tantalum oxide, titanium oxide, lanthanum oxide, yttrium oxide, aluminum oxide, and mixtures thereof. The second layer can be a titanium nitride layer 604. The third layer can be a tantalum nitride layer 606. The titanium nitride layer 604 and tantalum nitride layer 606 can be referred to as metal layers formed from a thermally stable metal such as titanium nitride, tantalum nitride, tantalum carbide, titanium aluminum nitride, tantalum aluminum nitride, or their derivatives. The fourth layer, the fifth layer and the sixth layer can be a multilayer hardmask 624. The fourth layer can be a silicon nitride hardmask 608. The fifth layer can be an interlayer oxide 610. The interlayer oxide 610 can be an oxide such as silicon oxide or silicon oxynitride. The sixth layer can be a silicon nitride hardmask 612.

In various embodiments, the lithographic stack 622 can be formed over the RRAM stack 620. The lithographic stack 622 can include an ODL 614 formed over the multilayer hardmask 624, more specifically, over the silicon nitride hardmask 612 of the RRAM stack 620. An ARC 616 can be formed over the ODL 614. A photoresist layer 618 can be formed over portions of the ARC 616. For example, the photoresist layer 618 can be aligned to the first alignment mark 116 and formed over portions of the ARC 616 in the region of the second alignment mark 118 and over a portion of the ARC 616 in the RRAM region 122. The thickness of the ODL 614 can be in a range from about 50 nm to about 300 nm. For example, the thickness of the ODL 614 can be about 200 nm.

Figure 7:
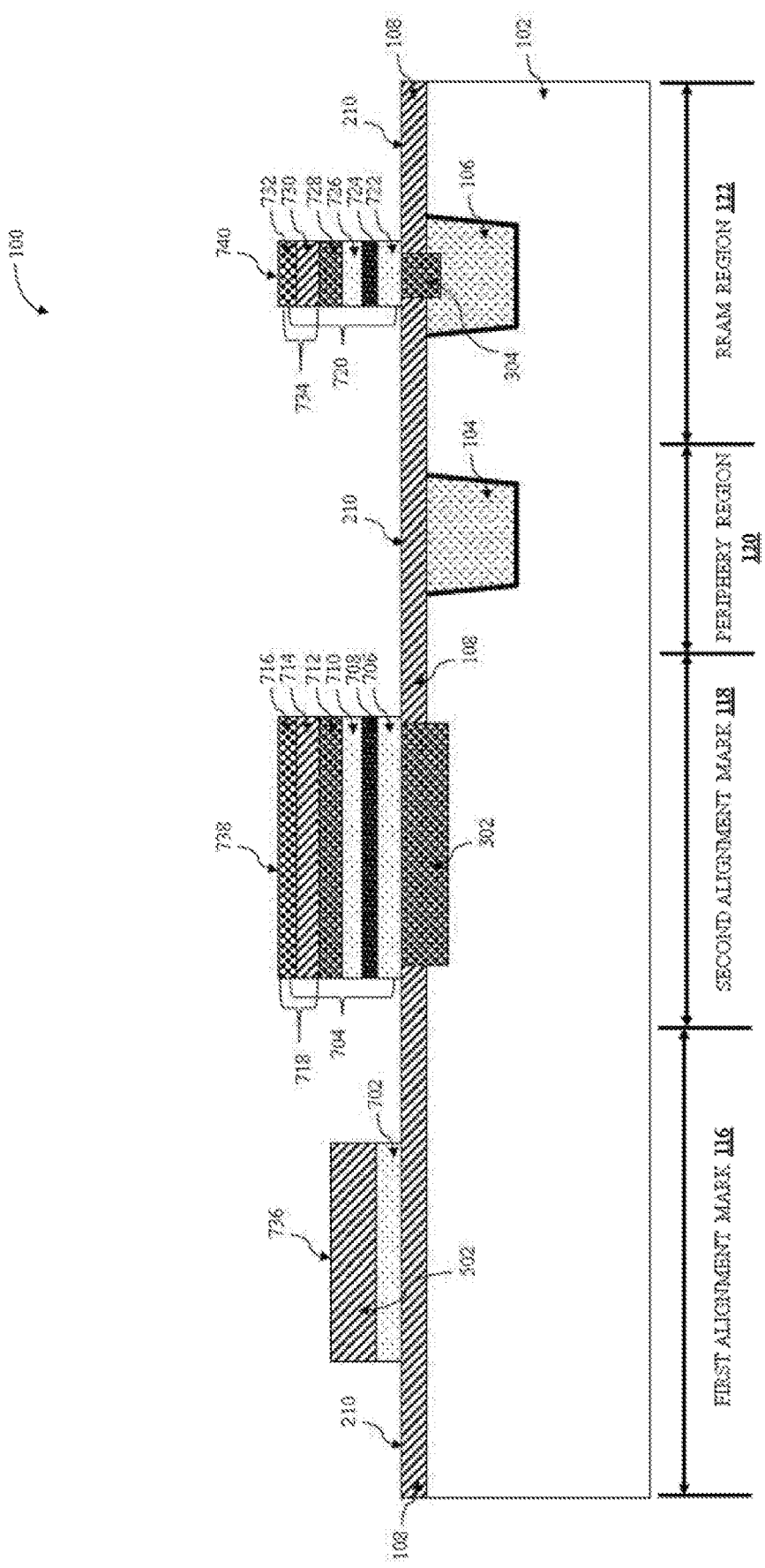
FIG. 7 illustrates a cross-sectional diagram of the semiconductor structure of FIG. 6 with the RRAM stack and the lithographic stack etched forming multiple RRAM stacks having a two-layer hardmask in accordance with one or more embodiments described herein.

FIG. 7 illustrates a cross-sectional diagram of the semiconductor structure 100 of FIG. 6 with the RRAM stack 620 and the lithographic stack 622 etched forming multiple RRAM stacks (e.g., a first RRAM stack 704 over the first metal nitride layer 302 and a second RRAM stack 720 over the conductive line 106) having a two-layer hardmask in accordance with one or more embodiments described herein. In various embodiments, the ODL 614, the ARC 616 and the photoresist layer 618 can be etched to form a stack of the silicon nitride hardmask portion 502 and the bottom electrode portion 702, the first RRAM stack 704 and the second RRAM stack 720. The etching can be, for example, a RIE. The etching can expose the top surface 210 of the silicon nitride cap 108. The etching can also expose a top surface 736 of the silicon nitride hardmask portion 502 that can remain over a bottom electrode portion 702 of the bottom electrode 402. The silicon nitride hardmask 612 of the RRAM stack 620 can be removed in forming the first RRAM stack 704 and the second RRAM stack 720. The silicon nitride hardmask 612 can be etched to expose a top surface 738 of the first RRAM stack 704 (e.g., the top surface 738 of an interlayer oxide 716) and to expose a top surface 740 of the second RRAM stack 720 (e.g., the top surface 740 of an interlayer oxide 732).

The first RRAM stack 704 can comprise six layers. The first layer can be a titanium nitride layer 706. The first layer can be referred to as the bottom electrode. The second layer can be a hafnium oxide layer 708. The third layer can be a titanium nitride layer 710. The fourth layer can be a tantalum nitride layer 712. The third layer and the fourth layer can be referred to as the top electrodes. The fifth layer and the sixth layer can be a multilayer hardmask 718, a two-layer hardmask. The fifth layer can be a silicon nitride hardmask 714. The sixth layer can be the interlayer oxide 716. The interlayer oxide 716 can comprise an oxide such as silicon oxide or silicon oxynitride. The first RRAM stack 704 can be formed over the first metal nitride layer 302.

Similarly, the second RRAM stack 720 can comprise six layers. The first layer can be a titanium nitride layer 722. The first layer can be referred to as the bottom electrode. The second layer can be a hafnium oxide layer 724. The third layer can be a titanium nitride layer 726. The fourth layer can be a tantalum nitride layer 728. The third layer and the fourth layer can be referred to as the top electrodes. The fifth layer and the sixth layer can be a multilayer hardmask 734, a two-layer hardmask. The fifth layer can be a silicon nitride hardmask 730. The sixth layer can be the interlayer oxide 732. The interlayer oxide 732 can comprise an oxide such as silicon oxide or silicon oxynitride. The second RRAM stack 720 can be formed over the second metal nitride layer 304 and over the conductive line 106.

Figure 8:
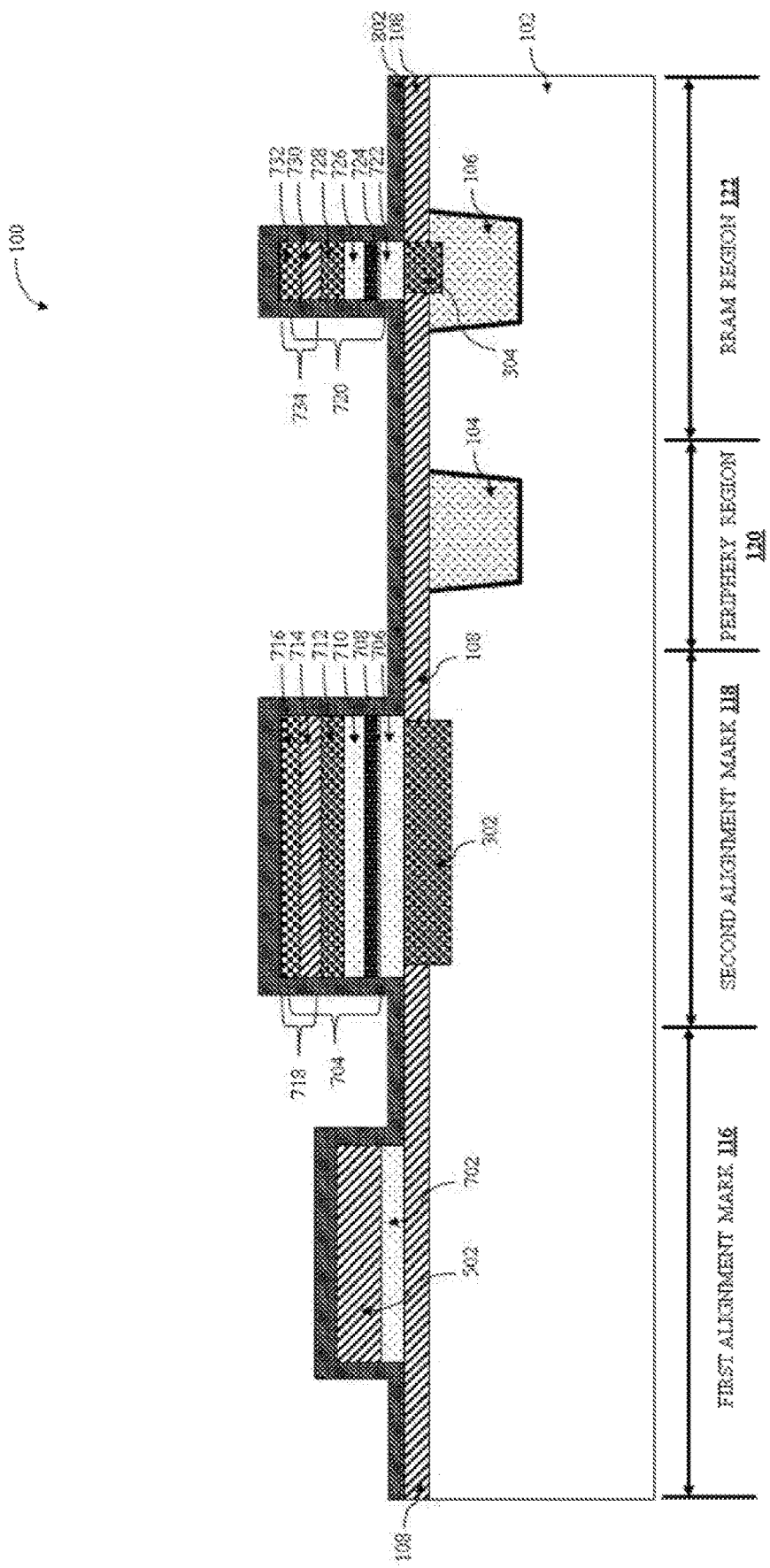
FIG. 8 illustrates a cross-sectional diagram of the semiconductor structure of FIG. 7 with a silicon nitride encapsulation over the RRAM stacks in accordance with one or more embodiments described herein.

FIG. 8 illustrates a cross-sectional diagram of the semiconductor structure 100 of FIG. 7 with a silicon nitride encapsulation 802 over the first RRAM stack 704 and the second RRAM stack 720 in accordance with one or more embodiments described herein. The silicon nitride encapsulation 802 can be a dielectric material such as silicon nitride. The silicon nitride encapsulation 802 can be formed over the top surface 210 of the silicon nitride cap 108. The silicon nitride encapsulation 802 can encapsulate the stack of the silicon nitride hardmask portion 502 and the bottom electrode portion 702, the first RRAM stack 704 and the second RRAM stack 720.

Figure 9:
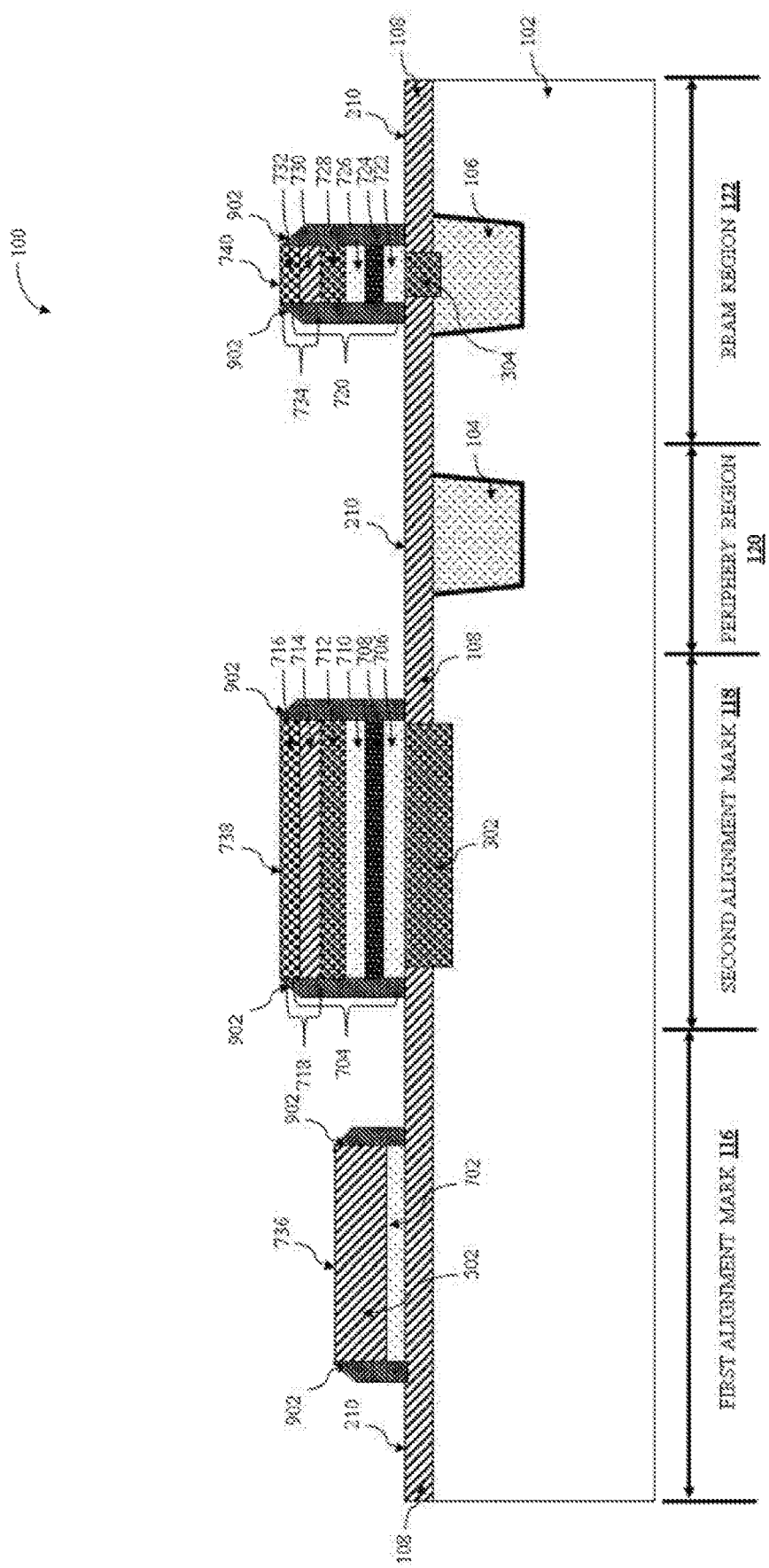
FIG. 9 illustrates a cross-sectional diagram of the semiconductor structure of FIG. 8 with the silicon nitride encapsulation etched to form silicon nitride outer spacers adjacent to the first RRAM stacks in accordance with one or more embodiments described herein.

FIG. 9 illustrates a cross-sectional diagram of the semiconductor structure 100 of FIG. 8 with the silicon nitride encapsulation 802 etched to form silicon nitride outer spacers 902 adjacent to the first RRAM stack 704 and the second RRAM stack 720 in accordance with one or more embodiments described herein. In various embodiments, the silicon nitride encapsulation 802 can be etched to form the silicon nitride outer spacers 902. The silicon nitride outer spacers 902 can be adjacent to the stack of the silicon nitride hardmask portion 502 and the bottom electrode portion 702, the first RRAM stack 704 and the second RRAM stack 720. The silicon nitride encapsulation 802 can be selectively etched by, for example, RIE.

The silicon nitride encapsulation 802 can be selectively etched to expose the top surface 736 of the silicon nitride hardmask portion 502. The silicon nitride encapsulation 802 can be selectively etched to expose the top surface 738 of the first RRAM stack 704, more specifically, the top surface 738 of the interlayer oxide 716. The silicon nitride encapsulation 802 can also be selectively etched to expose a top surface 740 of the second RRAM stack 720, more specifically, the top surface 740 of the interlayer oxide 732.

Figure 10:
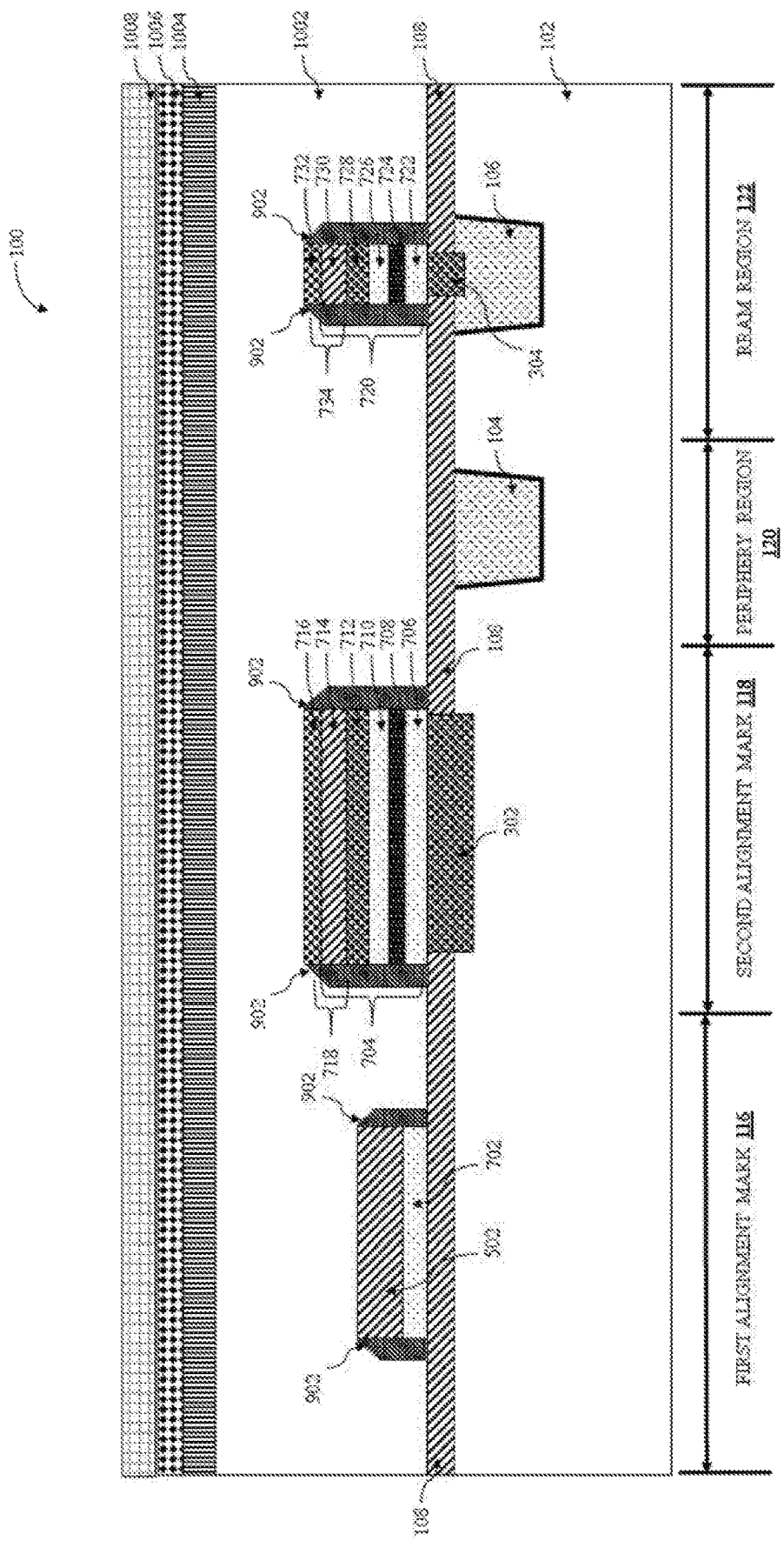
FIG. 10 illustrates a cross-sectional diagram of the semiconductor structure of FIG. 9 with an interlayer dielectric and sacrificial layers deposited in accordance with one or more embodiments described herein.

FIG. 10 illustrates a cross-sectional diagram of the semiconductor structure 100 of FIG. 9 with an ILD 1002 and sacrificial layers deposited in accordance with one or more embodiments described herein. In various embodiments, the ILD 1002, a low-k dielectric, can be formed over the silicon nitride cap 108, the silicon nitride hardmask portion 502, the first RRAM stack 704 and the second RRAM stack 720. A low-k dielectric material used for the ILD 1002 can have a dielectric constant that is less than 4.0, for example, 3.9. In example embodiments, the low-k dielectric material used for the ILD 1002 can have a dielectric constant ranging from about 1.0 to about 3.5. In other example embodiments, the low-k dielectric material used for the ILD 1002 can have a dielectric constant ranging from about 1.75 to about 3.2.

An example low-k material used for the ILD 1002 can comprise silicon oxycarbonitride. It can be appreciated that other low-k materials can be utilized for the ILD 1002 such as, for example, fluorine doped silicon oxide, carbon doped silicon oxide, porous silicon oxide, porous carbon doped silicon oxide, organosilicate glass (OSG), diamond-like carbon (DLC) and combinations thereof. In some embodiments, the ILD 1002 can be conformally deposited using CVD. Variations of the CVD process suitable for forming the ILD 1002 can include, but not limited to, atmospheric pressure chemical vapor deposition (APCVD), low pressure chemical vapor deposition (LPCVD), plasma enhanced chemical vapor deposition (PECVD), metal-organic chemical vapor deposition (MOCVD) and combinations thereof. In some embodiments, the ILD 1002 can have a thickness ranging from about 50 nm to about 300 nm. In another embodiment, the ILD 1002 can have a thickness ranging from about 100 nm to about 150 nm.

Sacrificial layers can be deposited over the ILD 1002. For example, three sacrificial layers can be deposited over the ILD 1002. The first sacrificial layer can be a sacrificial silicon nitride hardmask 1004. The second sacrificial layer can be a titanium nitride hardmask 1006. The third sacrificial layer can be a tetraethyl orthosilicate hardmask 1008.

Figure 11:
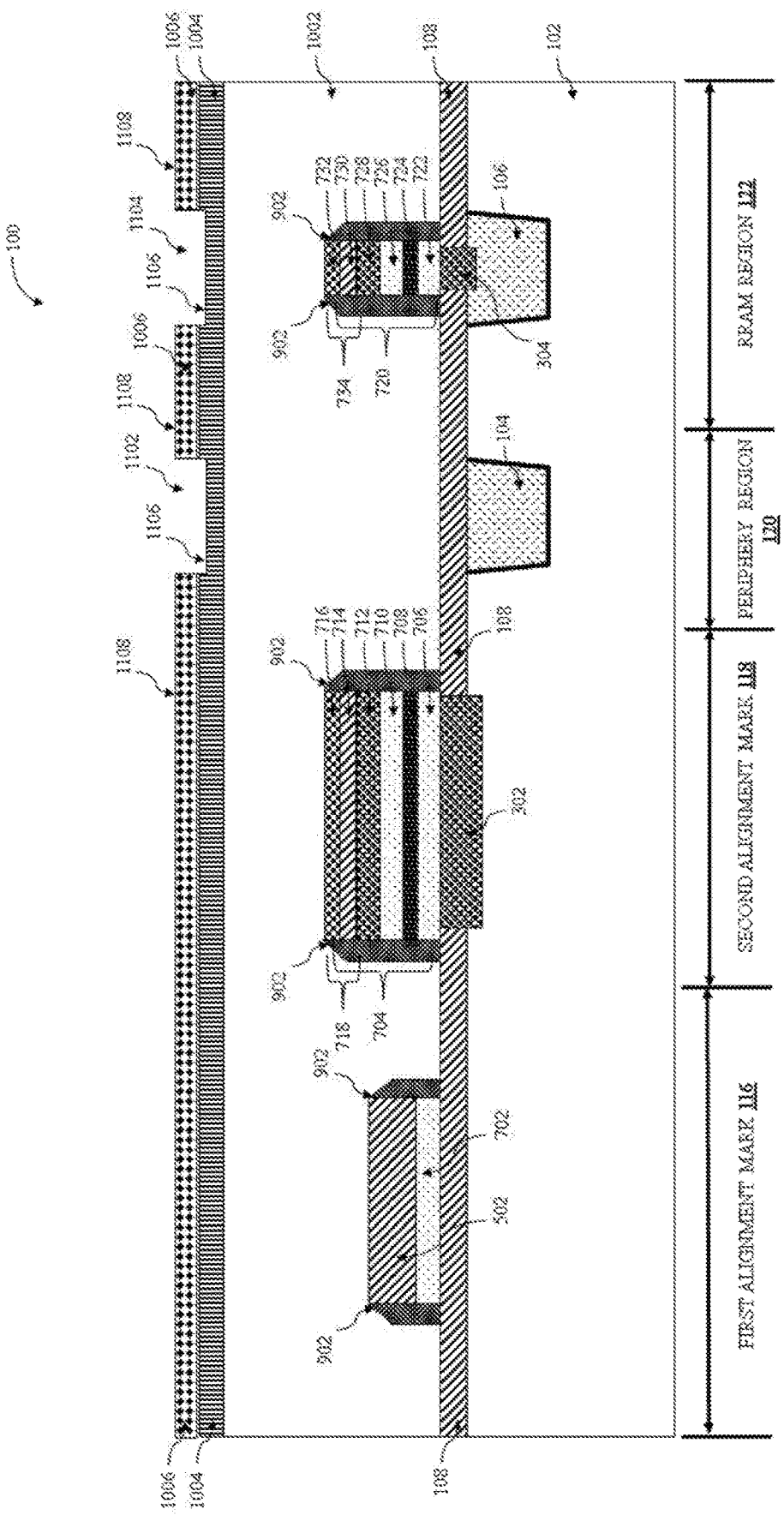
FIG. 11 illustrates a cross-sectional diagram of the semiconductor structure of FIG. 10 with the sacrificial layers etched to form openings directly over the conductive lines in accordance with one or more embodiments described herein.

FIG. 11 illustrates a cross-sectional diagram of the semiconductor structure 100 of FIG. 10 with the sacrificial layers (e.g., the sacrificial silicon nitride hardmask 1004, the titanium nitride hardmask 1006 and the tetraethyl orthosilicate hardmask 1008) etched to form openings (e.g., an opening 1102 and an opening 1104) directly over the conductive lines (e.g., the conductive line 104 and the conductive line 106) in accordance with one or more embodiments described herein. In various embodiments, the titanium nitride hardmask 1006 and the tetraethyl orthosilicate hardmask 1008 can be etched by, for example, RIE, to create a recess or opening 1102 over the conductive line 104 and to create a recess or opening 1104 over the conductive line 106. The tetraethyl orthosilicate hardmask 1008 can be removed. Portions of the titanium nitride hardmask 1006 can be etched and removed to form the opening 1102 and the opening 1104. The sacrificial silicon nitride hardmask 1004 can remain intact. In creating the opening 1102 and the opening 1104, the top surface 1106 of the silicon nitride hardmask 1004 can be exposed. In removing the tetraethyl orthosilicate hardmask 1008, the top surface 1108 of the titanium nitride hardmask 1006 can be exposed.

Figure 12:
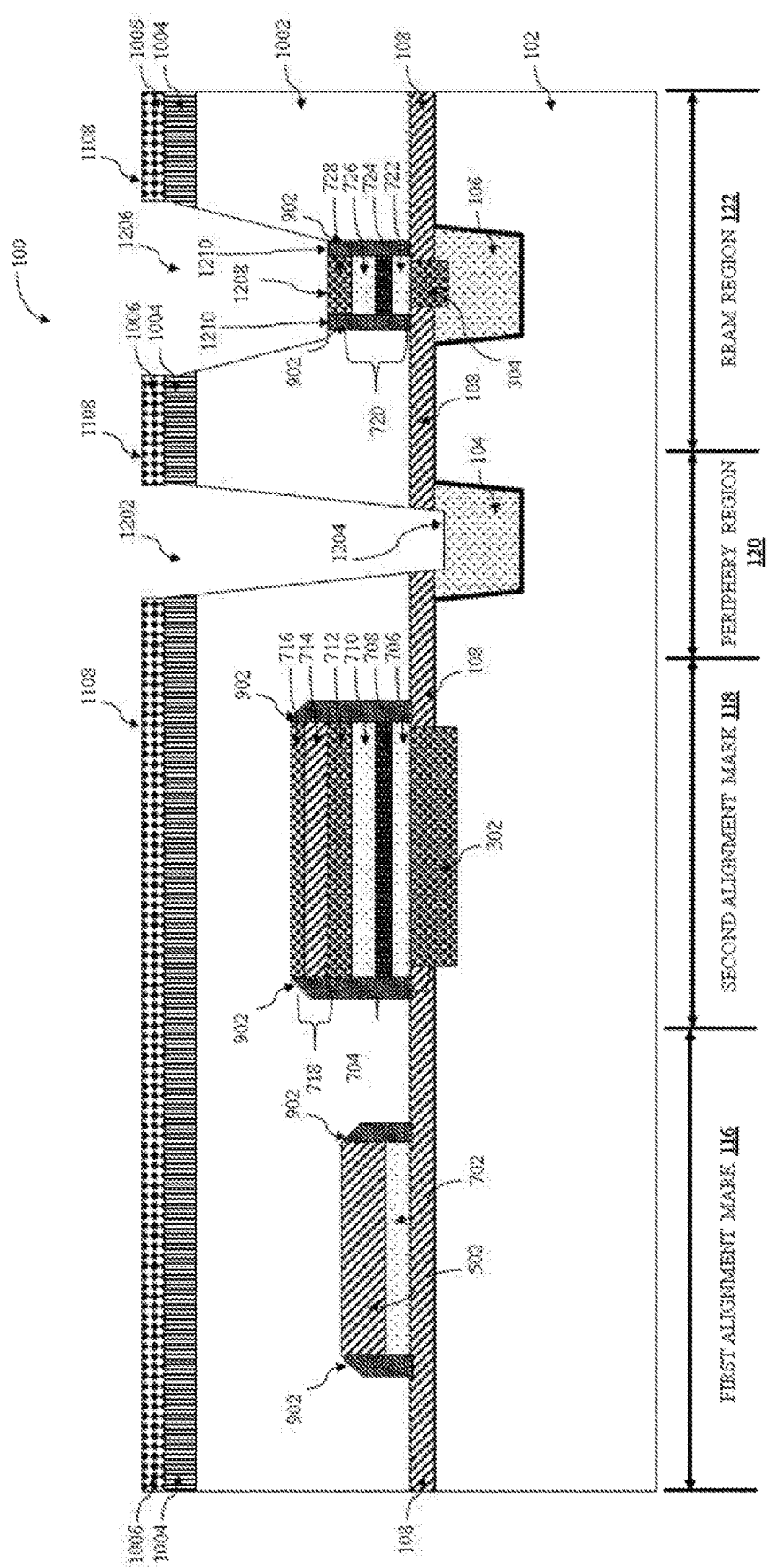
FIG. 12 illustrates a cross-sectional diagram of the semiconductor structure of FIG. 11 with trenches formed exposing a conductive line and a RRAM stack over a conductive line in accordance with one or more embodiments described herein.

FIG. 12 illustrates a cross-sectional diagram of the semiconductor structure 100 of FIG. 11 with trenches (e.g., a trench 1202 and a trench 1206) formed exposing the conductive line 104 and the second RRAM stack 720 over the conductive line 106 in accordance with one or more embodiments described herein. In various embodiments, the trench 1202 and the trench 1206 can be formed by etching, for example, RIE to create additional connecting conductive lines and vias. The trench 1202 can be formed to extend to a top surface 1204 of the conductive line 104. Portions of the silicon nitride cap 108 and conductive line 104 can be removed in creating the trench 1202 extending to the conductive line 104. The trench 1206 can be formed to extend to a top surface 1208 of the tantalum nitride layer 728 (e.g., a top electrode) of the second RRAM stack. The multilayer hardmask 734 (e.g., comprising the silicon nitride hardmask 730 and the interlayer oxide 732) and portions of the silicon nitride outer spacers 902 adjacent to the multilayer hardmask 734 can be removed in creating the trench 1206 extending to the second RRAM stack 720. Top surfaces 1210 of the silicon nitride outer spacers 902 adjacent to the second RRAM stack 720 can be exposed.

Figure 13:
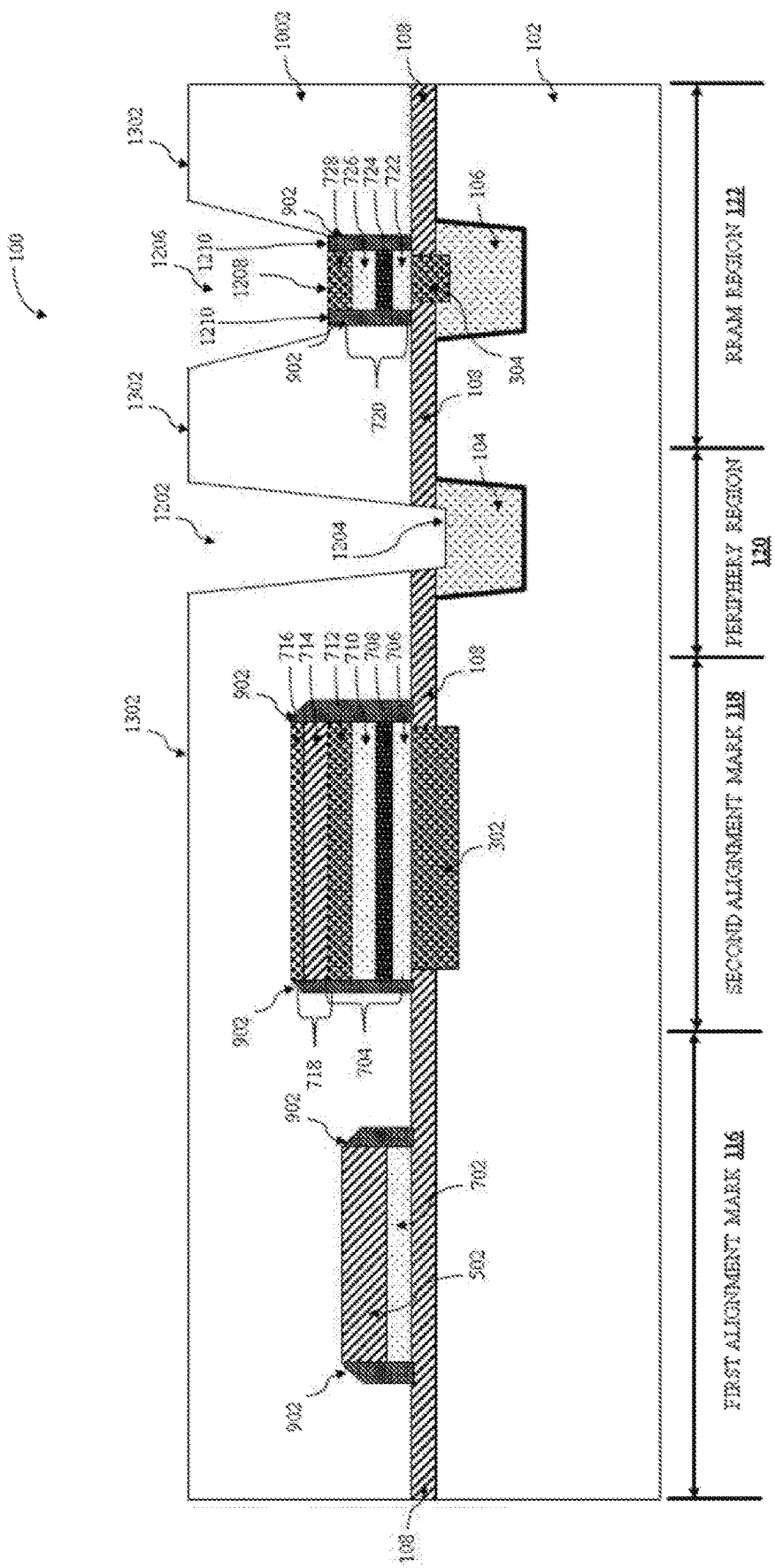
FIG. 13 illustrates a cross-sectional diagram of the semiconductor structure of FIG. 12 with the sacrificial layers removed in accordance with one or more embodiments described herein.

FIG. 13 illustrates a cross-sectional diagram of the semiconductor structure 100 of FIG. 12 with the sacrificial layers (e.g., the sacrificial silicon nitride hardmask 1004 and the titanium nitride hardmask 1006) removed in accordance with one or more embodiments described herein. In various embodiments, the sacrificial silicon nitride hardmask 1004 and the titanium nitride hardmask 1006 can be completely removed to expose a top surface 1302 of the ILD 1002. The sacrificial silicon nitride hardmask 1004 and the titanium nitride hardmask 1006 can be completely removed by wet etching.

Figure 14:
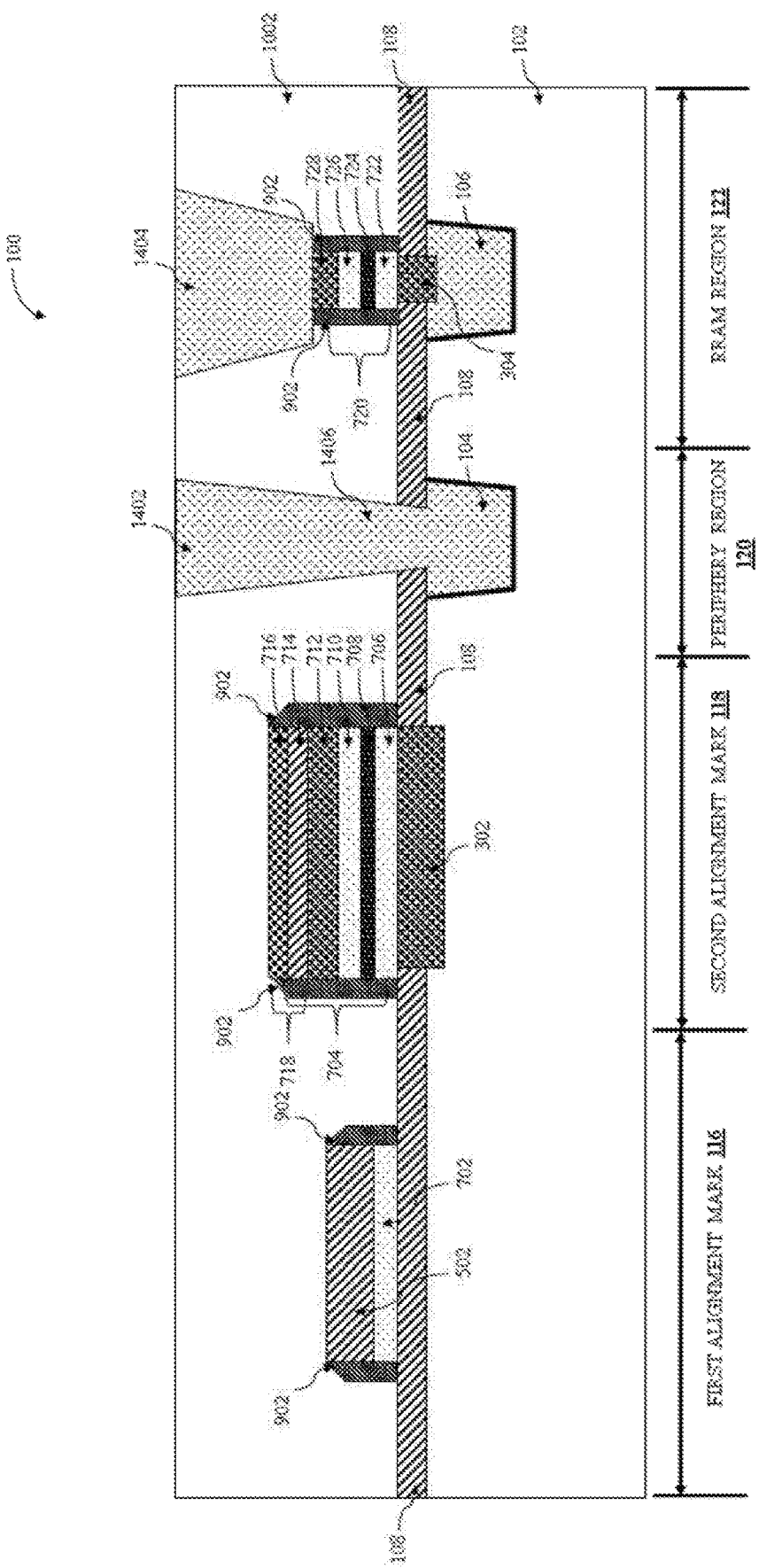
FIG. 14 illustrates a cross sectional diagram of the semiconductor structure of FIG. 13 with additional connecting conductive lines and copper vias formed by a metallization process while retaining a two-layer hardmask in accordance with one or more embodiments described herein.

FIG. 14 illustrates a cross sectional diagram of the semiconductor structure 100 of FIG. 13 with additional connecting conductive lines (e.g., a conductive line 1402 and a conductive line 1404) and copper vias (e.g., a copper via 1406) formed by a metallization process while retaining a two-layer hardmask in accordance with one or more embodiments described herein. The metallization process can include filling the trench 1202 and the trench 1206 with a metal fill and planarizing the metal fill. In various example embodiments, a conductive material can be deposited in the trench 1202 and the trench 1206 to form the conductive line 1402, the conductive 1404 and the copper via 1406. The metallization can be a single damascene metallization. The conductive material can be a metal that can comprise copper, cobalt, aluminum, platinum, gold, tungsten, titanium, ruthenium or a combination thereof.

In preferred embodiments, the conductive material can comprise copper. Copper can be the preferred conductive material in order to make a large scale crossbar array because line resistance needs to be minimized to mitigate the voltage drop across the line. The conductive material can be deposited by a suitable deposition process such as, for example, CVD, PECVD, PVD, plating, thermal or e-beam evaporation, or sputtering. In various exemplary embodiments, the height of the deposited conductive material can be reduced by CMP and/or etching. It can be appreciated that other planarization, other than CMP, can be employed, such as, for example, grinding and polishing.

As used throughout the instant application, the term "copper" can be used to include substantially pure elemental copper; copper including unavoidable impurities including a native oxide; and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In some embodiments, the copper alloy can be a copper-manganese alloy. In other embodiments, in lieu of copper, a cobalt metal or a cobalt metal alloy can be employed. The copper-containing (or a metal or alloy in lieu of copper) structures can be electrically conductive. The term "conductive" can be used through the present disclosure to refer to a material having a room temperature electrical conductivity of at least $10^{-8}$ ohm meter $(\Omega\text{-m})^{-1}$.

FIG. 14 illustrates the semiconductor structure 100 with formed vias (e.g., the copper via 1406) and the multilayer hardmask 718 retained in the first RRAM stack 704 having a two-layer hardmask. The first hardmask layer is the silicon nitride hardmask 714. The second hardmask layer is the interlayer oxide 716. The interlayer oxide 716 can be an oxide such as silicon oxide or silicon oxynitride. It can be appreciated that the semiconductor structure 100 with formed vias can retain a multilayer hardmask in a RRAM stack having a three-layer hardmask as illustrated below in FIG. 15 and FIG. 16.

Figure 15:
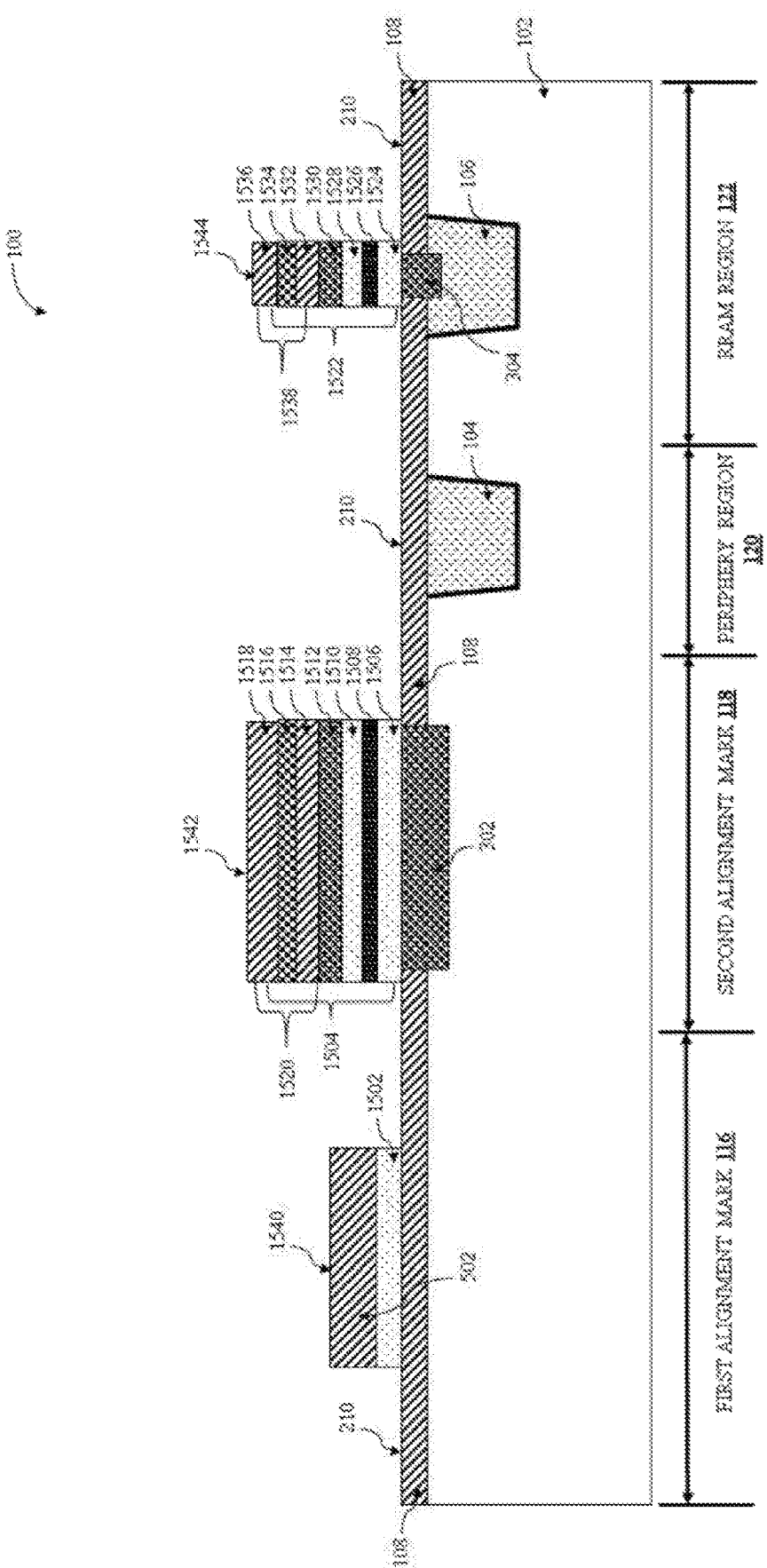
FIG. 15 illustrates a cross-sectional diagram of the semiconductor structure of FIG. 6 with multiple RRAM stacks formed having a three-layer hardmask in accordance with one or more embodiments described herein.

FIG. 15 illustrates a cross-sectional diagram of the semiconductor structure 100 of FIG. 6 with the RRAM stack 620 etched forming multiple RRAM stacks (e.g., a first RRAM stack 1504 over the first metal nitride layer 302 and a second RRAM stack 1522 over the conductive line 106) having a three-layer hardmask in accordance with one or more embodiments described herein. In various embodiments, the ODL 614, the ARC 616 and the photoresist layer 618 can be etched to form a stack of the silicon nitride hardmask portion 502 and the bottom electrode portion 1502, the first RRAM stack 1504 and the second RRAM stack 1522. The etching can be, for example, a RIE. The etching can expose the top surface 210 of the silicon nitride cap 108. The etching can also expose a top surface 1540 of the silicon nitride hardmask portion 502 that can remain over a bottom electrode portion 1502 of the bottom electrode 402. Portions of the silicon nitride hardmask 612 of the RRAM stack 620 can remain and be a part of the first RRAM stack 1504 and the second RRAM stack 1522. The lithographic stack 622 can be etched to expose a top surface 1542 of the first RRAM stack 1504 (e.g., the top surface 1542 of a silicon nitride hardmask 1518) and to expose a top surface 1544 of the second RRAM stack 1522 (e.g., the top surface 1544 of the silicon nitride hardmask 1536).

The first RRAM stack 1504 can comprise seven layers. The first layer can be a titanium nitride layer 1506. The first layer can be referred to as the bottom electrode. The second layer can be a hafnium oxide layer 1508. The third layer can be a titanium nitride layer 1510. The fourth layer can be a tantalum nitride layer 1512. The third layer and the fourth layer can be referred to as the top electrodes. The fifth layer, the sixth layer and the seventh layer can be a multilayer hardmask 1520, a three-layer hardmask. The fifth layer can be a silicon nitride hardmask 1514. The sixth layer can be an interlayer oxide 1516 (e.g., an oxide layer). The seventh layer can be a silicon nitride hardmask 1518. The first RRAM stack 704 can be formed over the first metal nitride layer 302.

Similarly, the second RRAM stack 1522 can comprise seven layers. The first layer can be a titanium nitride layer 1524. The first layer can be referred to as the bottom electrode. The second layer can be a hafnium oxide layer 1526. The third layer can be a titanium nitride layer 1528. The fourth layer can be a tantalum nitride layer 1530. The third layer and the fourth layer can be referred to as the top electrodes. The fifth layer, the sixth layer and the seventh layer can be a multilayer hardmask 1538, a three-layer hardmask. The fifth layer can be a silicon nitride hardmask 1532. The sixth layer can be an interlayer oxide 1534 (e.g., an oxide layer). The seventh layer can be a silicon nitride hardmask 1536. The second RRAM stack 1522 can be formed over the second metal nitride layer 304 and over the conductive line 106.

Figure 16:
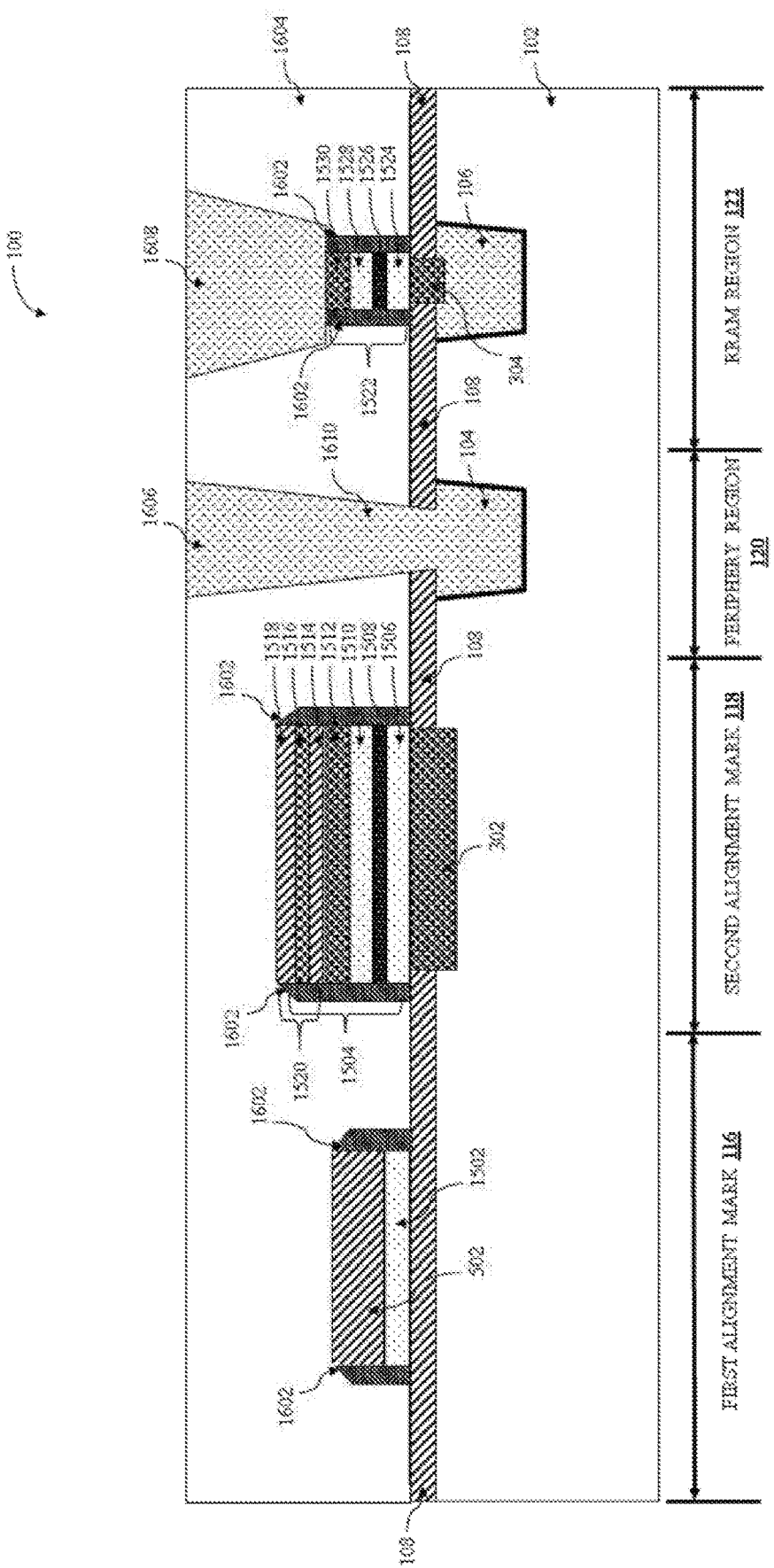
FIG. 16 illustrates a cross-sectional diagram of the semiconductor structure of FIG. 15 with additional connecting conductive lines and vias formed while retaining a three-layer hardmask in accordance with one or more embodiments described herein.

FIG. 16 illustrates a cross-sectional diagram of the semiconductor structure 100 of FIG. 15 with additional connecting conductive lines (e.g., a conductive line 11606 and a conductive line 1608) and vias (e.g., a via 1610) formed while retaining a three-layer hardmask in accordance with one or more embodiments described herein. The conductive line 1606, the conductive line 1608 and the via 1610 can be formed in the ILD 1604. The methods of forming the semiconductor structure 100 in FIG. 16 from FIG. 15 is similar to the methods of forming the semiconductor structure 100 in FIG. 14 from FIG. 7. For sake of brevity, repetitive description of similar methods and like elements employed in other embodiments described herein is omitted.

FIG. 16 illustrates the semiconductor structure 100 with formed via 1610 and a multilayer hardmask 1520 in the first RRAM stack 704 having a three-layer hardmask. The first hardmask layer can be the silicon nitride hardmask 1514. The second hardmask layer can be the interlayer oxide 1516 (e.g., an oxide layer). The interlayer oxide 1516 can be an oxide such as silicon oxide or silicon oxynitride. The third hardmask layer can be the silicon nitride hardmask 1518. The multilayer hardmask 1538 (e.g., comprising the silicon nitride hardmask 1532, the oxide layer 1534 and the silicon nitride hardmask 1536) in the second RRAM stack 1522 and portions of the silicon nitride outer spacers 1602 adjacent to the multilayer hardmask 1538 can be removed in creating the conductive line 1608 extending to the second RRAM stack 1522.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a resistive random access memory (RRAM) comprising a multilayer hardmask, wherein the multilayer hardmask comprises an interlayer oxide, and wherein the multilayer hardmask comprises a first layer of silicon nitride and a second layer of silicon nitride, and wherein the interlayer oxide is between the first layer of silicon nitride and the second layer of silicon nitride.

2. The device of claim 1, wherein the RRAM comprises a first electrode layer selected from a group consisting of titanium nitride, tantalum nitride and tungsten.

3. The device of claim 1, wherein the RRAM comprises a metal oxide selected from a group consisting of hafnium oxide, tantalum oxide, titanium oxide and aluminum oxide.

4. The device of claim 1, wherein the RRAM comprises a second electrode layer selected from a group consisting of titanium, titanium nitride and a combination of titanium and titanium nitride.

5. The device of claim 1, wherein the multilayer hardmask comprises two layers, and wherein the two layers comprises the interlayer oxide on the first layer of silicon nitride.

6. The device of claim 1, wherein the interlayer oxide causes a surface oxidation of the first layer of silicon nitride.

7. The device of claim 1, wherein the interlayer oxide comprises an oxide, and wherein the oxide comprises silicon oxide or silicon oxynitride.

8. A method, comprising:
forming a resistive random access memory (RRAM) comprising a multilayer hardmask, wherein the multilayer hardmask comprises an interlayer oxide, and wherein the multilayer hardmask comprises a first layer of silicon nitride and a second layer of silicon nitride, and wherein the interlayer oxide is between the first layer of silicon nitride and the second layer of silicon nitride.

9. The method of claim 8, further comprising building the RRAM between copper lines.

10. The method of claim 8, wherein the RRAM comprises a first electrode layer selected from a group consisting of titanium nitride, tantalum nitride and tungsten.

11. The method of claim 8, wherein the RRAM comprises a metal oxide selected from a group consisting of hafnium oxide, tantalum oxide, titanium oxide and aluminum oxide.

12. The method of claim 8, wherein the RRAM comprises a second electrode layer selected from a group consisting of titanium, titanium nitride and a combination of titanium and titanium nitride.

13. The method of claim 8, further comprising removing the second layer of silicon nitride.

14. The method of claim 8, wherein the multilayer hardmask comprises two layers, and wherein the two layers comprises the interlayer oxide on the first layer of silicon nitride.

15. The device of claim 8, wherein the interlayer oxide comprises an oxide, and wherein the oxide comprises silicon oxide or silicon oxynitride.

16. A device, comprising:
 a resistive random access memory (RRAM) comprising a multilayer hardmask, wherein the multilayer hardmask comprises a first layer of an oxide on a first layer of silicon nitride, and wherein the multilayer hardmask comprises a second layer of silicon nitride, and wherein the layer of an oxide is between the first layer of silicon nitride and the second layer of silicon nitride.

* * * * *